(12) United States Patent
Xia et al.

(10) Patent No.: US 11,500,574 B2
(45) Date of Patent: Nov. 15, 2022

(54) STORAGE DETECTION METHOD, STORAGE DETECTION DEVICE, AND SMART STORAGE DEVICE

(71) Applicant: Yungu (Gu' an) Technology Co., Ltd., Langfang (CN)

(72) Inventors: Xianxu Xia, Langfang (CN); Gang Wang, Langfang (CN); Yin Wang, Langfang (CN); Lan Chen, Langfang (CN); Ronghui Qian, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 619 days.

(21) Appl. No.: 16/513,746

(22) Filed: Jul. 17, 2019

(65) Prior Publication Data

US 2019/0339899 A1 Nov. 7, 2019

Related U.S. Application Data

(63) Continuation of application No. PCT/CN2018/102545, filed on Aug. 27, 2018.

(30) Foreign Application Priority Data

May 30, 2018 (CN) .......................... 201810541009.1

(51) Int. Cl.
*B65D 90/48* (2006.01)
*G01R 33/07* (2006.01)
(Continued)

(52) U.S. Cl.
CPC ........... *G06F 3/0653* (2013.01); *B65D 90/48* (2013.01); *G01R 33/07* (2013.01); *G06F 3/0607* (2013.01);
(Continued)

(58) Field of Classification Search
CPC ..................................................... G06F 3/0653
See application file for complete search history.

(56) References Cited

U.S. PATENT DOCUMENTS 10,074,247 B1 * 9/2018 Tang ...................... G08B 13/08
10,789,822 B1 * 9/2020 Deutsch ................. G08B 13/26
(Continued)

FOREIGN PATENT DOCUMENTS

| CN | 2914819 Y | 6/2007 |
| CN | 101046832 A | 10/2007 |

(Continued)

OTHER PUBLICATIONS

CN First Office Action dated Jul. 18, 2019 in the corresponding CN application (application No. 201810541009.1).

(Continued)

*Primary Examiner* — Joseph H Feild
*Assistant Examiner* — Pameshanand Mahase
(74) *Attorney, Agent, or Firm* — Kilpatrick Townsend & Stockton

(57) ABSTRACT

The present disclosure relates to a storage detection module group for assisting a storage device to realize smart storage. The storage device includes at least one storage unit, and the storage detection module group includes: at least one detection module mounted on at least one storage unit of the storage device and configured to detect the storage state of at least one storage unit; a communication module configured to send a request for updating storage information of an article to the server, in order to allow the server to obtain a updated storage information of an article according to the request for updating storage information of an article, when the detection module detects that the storage state of at least (Continued)

one storage unit is changed; a power module configured to supply an operating voltage for the detection module and the communication module.

16 Claims, 4 Drawing Sheets

(51) Int. Cl.
    *G08B 13/08* (2006.01)
    *H04W 4/80* (2018.01)
    *H04W 4/00* (2018.01)
    *G06F 3/06* (2006.01)
    *G06V 40/20* (2022.01)

(52) U.S. Cl.
    CPC ............ *G06V 40/28* (2022.01); *G08B 13/08* (2013.01); *H04W 4/80* (2018.02); *B65D 2590/00* (2013.01); *B65D 2590/0083* (2013.01); *G06F 3/067* (2013.01); *H04W 4/00* (2013.01)

(56) References Cited

U.S. PATENT DOCUMENTS

| | | | |
|---|---|---|---|
| 2009/0015245 A1* | 1/2009 | Burrows | A61J 7/0481 |
| | | | 324/207.2 |
| 2015/0234364 A1 | 8/2015 | Gardner et al. | |
| 2016/0033194 A1 | 2/2016 | Sumihiro et al. | |
| 2016/0313442 A1* | 10/2016 | Ho | A61B 5/0008 |
| 2019/0235683 A1* | 8/2019 | Hou | G06F 1/1652 |
| 2021/0074100 A1* | 3/2021 | Kashi | H04W 12/08 |
| 2021/0264503 A1* | 8/2021 | Hara | G07G 1/0063 |

FOREIGN PATENT DOCUMENTS

| | | |
|---|---|---|
| CN | 101159057 A | 4/2008 |
| CN | 202664808 U | 1/2013 |
| CN | 104460641 A | 3/2015 |
| CN | 104616159 A | 5/2015 |
| CN | 104617988 A | 5/2015 |
| CN | 105319975 A | 2/2016 |
| CN | 105352260 A | 2/2016 |
| CN | 105631574 A | 6/2016 |
| CN | 105752481 A | 7/2016 |
| CN | 105919307 A | 9/2016 |
| CN | 206075423 U | 4/2017 |
| CN | 107102560 A | 8/2017 |
| CN | 107125957 A | 9/2017 |
| CN | 107184400 A | 9/2017 |
| CN | 107203142 A | 9/2017 |
| CN | 107331040 A | 11/2017 |
| CN | 107367953 A | 11/2017 |
| CN | 107465836 A | 12/2017 |
| CN | 107862770 A | 3/2018 |
| KR | 101854077 B1 | 5/2018 |
| TW | 200942370 A | 10/2009 |
| TW | 200951654 A | 12/2009 |
| TW | 201447204 A | 12/2014 |
| TW | I556792 B | 11/2016 |
| TW | M549052 U | 9/2017 |
| WO | 2011107878 A1 | 9/2011 |
| WO | 2018194232 A1 | 10/2018 |
| WO | 2018196779 A1 | 11/2018 |

OTHER PUBLICATIONS

TW Office Action dated Feb. 25, 2019 in the corresponding TW application (application No. 107131869).

* cited by examiner

STORAGE DETECTION METHOD, STORAGE DETECTION DEVICE, AND SMART STORAGE DEVICE

CROSS-REFERENCES TO RELATED APPLICATIONS

This application is a continuation application of International Application No. PCT/CN2018/102545, filed on Aug. 27, 2018, which claims priority to Chinese Patent Application No. 201810541009.1, filed on May 30, 2018, entitled "SMART STORAGE DEVICE, SMART STORAGE SYSTEM". The entireties of these applications are incorporated by reference herein for all purposes.

TECHNICAL FILED

The present disclosure relates to the field of smart devices.

BACKGROUND

In daily life, people often suffer from the difficulty of finding what they need. In particular, in the case of small and fine articles, it is more difficult to find the articles when they are placed in a corner. In view of the above problems, there are some storage devices in the conventional technology, such as a storage box having compartments for storing small and fine articles. The storage box having compartments realizes the classified storage of the small and fine articles through a plurality of compartments.

SUMMARY

In view of the above, the present disclosure provides a storage detection method, a storage detection device, and a smart storage device that can update storage information of an article in time.

The present disclosure discloses a storage detection method for assisting a storage device to realize smart storage, including:

detecting a storage state of the storage device;

sending a request for updating storage information of an article to a server, in order to allow the server to obtain updated storage information of an article according to the request for updating storage information of an article, when detecting that the storage state of the storage device is changed.

In an embodiment, the detecting the storage state of the storage device includes: detecting a change in the surrounding magnetic field strength by a Hall sensor mounted in the storage device, thereby detecting the storage state of the storage device, when a user approaches or opens or closes the storage device.

In an embodiment, the method further includes: sending prompt information, and obtaining the request for updating storage information of an article sent according to the prompt information and the pre-update storage information of an article and the updated storage information of an article, when detecting that the storage state of the storage device is changed; and controlling a human-computer interaction module and a communication module, when detecting that the storage state of the storage device is changed.

The present disclosure provides a storage detection device for assisting the storage device including at least one storage unit to realize smart storage, including a storage detection module group, wherein the storage detection module group includes:

at least one detection module mounted on the at least one storage unit of the storage device and configured to detect the storage state of the at least one storage unit;

a communication module configured to send a request for updating storage information of an article to the server, in order to allow the server to obtain updated storage information of an article according to the request for updating storage information of an article, when the detection module detects that the storage state of the at least one storage unit is changed; and a power module configured to supply an operating voltage for the detection module and the communication module.

In an embodiment, the detection module includes at least one Hall sensor.

In an embodiment, the detection module further includes at least one of a temperature sensor and a humidity sensor.

In an embodiment, the communication module includes at least one of a WIFI module, a Bluetooth module, a ZigBee module, and a mobile data communication module.

In an embodiment, the storage detection device further includes:

the human-computer interaction module configured to send prompt information, and to obtain the request for updating storage information of an article sent according to the prompt information, the pre-update storage information of an article, and the updated storage information of an article, when the detection module detects that the storage state of the storage unit is changed;

a processor configured to control the human-computer interaction module and the communication module, when the detection module detects that the storage state of the storage unit is changed.

In an embodiment, the storage detection device further includes:

a memory module configured to store the pre-update storage information of an article and the updated storage information of an article.

In an embodiment, the human-computer interaction module includes:

a voice module configured to send voice prompt information according to the control of the processor; and a touch screen configured to display text prompt information, the pre-update storage information of an article, and the updated storage information of an article according to the control of the processor.

In an embodiment, the touch screen is a flexible screen.

In an embodiment, the human-computer interaction module includes a gesture recognition module configured to change the storage state of the storage unit according to the gesture of the user.

In an embodiment, the gesture recognition module is configured to make the storage unit display the storage information of an article in the storage unit according to a one-hand swiping gesture of the user.

In an embodiment, the gesture recognition module is configured to make the storage unit perform an opening action according to a lifting gesture of the user.

In an embodiment, the gesture recognition module is configured to make the storage unit perform a closing action according to a pressing gesture of the user.

The present disclosure provides a smart storage device including:

a top base configured to accommodate the communication module, the human-computer interaction module, and a processor;

at least one storage unit mounted with the detection module;

a bottom base configured to support the storage unit and accommodate the power module;

wherein the detection module is configured to detect the storage state of the at least one storage unit;

the communication module is configured to send a request for updating storage information of an article to the server, in order to allow the server to obtain updated storage information of an article according to the request for updating storage information of an article, when the detection module detects that the storage state of the at least one storage unit is changed;

the power module is configured to provide an operating voltage;

the human-computer interaction module is configured to send prompt information, and to obtain the request for updating storage information of an article sent according to the prompt information, pre-update storage information of an article, and the updated storage information of an article, when the detection module detects that the storage state of the storage unit is changed;

The processor is configured to control the human-computer interaction module and the communication module, when the detection module detects that the storage state of the storage unit is changed.

The storage detection module group, the storage detection device, and the smart storage device of the present disclosure can update the storage information of an article in time without requiring the user to handwrite the memo, thereby greatly facilitating the user to seek for the articles.

BRIEF DESCRIPTION OF THE DRAWINGS

To illustrate the technical solutions according to the embodiments of the present disclosure more clearly, the accompanying drawings for describing the embodiments are introduced briefly below. Apparently, the accompanying drawings in the following description only illustrate some embodiments of the present disclosure, and a person skilled in the art can derive other drawings from the accompanying drawings without creative efforts.

DETAILED DESCRIPTION OF THE INVENTION

For a conventional storage device, when the user needs to find a certain article, the user has to look through each compartment for determining the storage location of the desired article. Even if a handwritten memo is used to avoid rummaging around, it is difficult to update the corresponding memo in time if the storage location of the article changes, which is inconvenient.

Reference will be made to the drawings and embodiments to describe the present disclosure in detail, so that the objects, technical solutions and advantages of the present disclosure can be more apparent and understandable. It should be understood that the specific embodiments described herein are only used to explain the present disclosure and not intended to limit the present disclosure.

It should be understood that when an element is defined as "fixed to" another element, it may be fixed directly on another element or on another element by other elements. When an element is considered to be "connected" to another element, it may be directly connected to another element or connected to another element by other elements. The terms "vertical", "horizontal", "left", "right", and the like are used herein for illustrative purposes only.

All technical and scientific terms used herein have the same meaning as commonly understood by one person skilled in the art to which this disclosure applies, unless otherwise defined. The terms used in the description of the present disclosure are for the purpose of describing the specific embodiments and are not intended to limit the disclosure. The term "and/or" used herein includes any and all combinations of one or more of the associated listed items.

In daily life, people often suffer from the difficulty of finding what they need. The conventional storage device realizes the classified storage of articles by means of compartment-storage. However, users still need to rummage around each compartment to locate what they need. In addition, even if the handwritten memo is used to avoid rummaging around, it is difficult to update the corresponding memo in time if the storage information of an article is changed, which is inconvenient.

Figure 1:
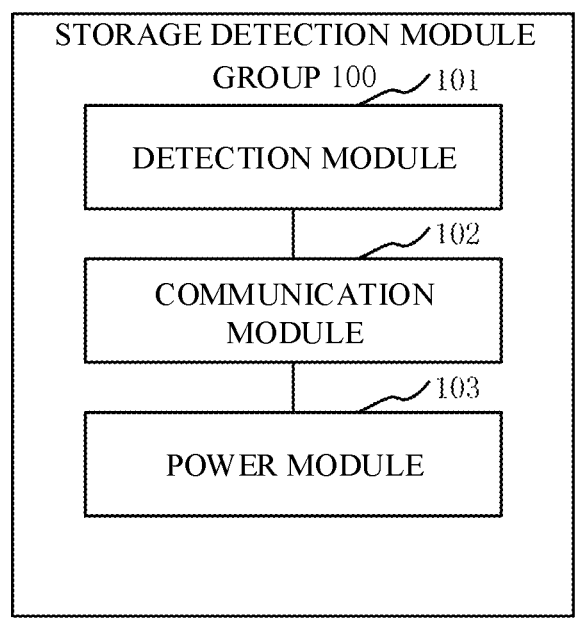
FIG. 1 is a schematic structural diagram of a storage detection module group according to an embodiment of the present disclosure.

As shown in FIG. 1, an embodiment of the present disclosure provides a storage detection module group 100 configured to assist the storage device to realize smart storage. The storage detection module group 100 includes at least one detection module 101, a communication module 102, and a power module 103.

The detection module 101 is mounted on at least one storage unit of the storage device and configured to detect the storage state of at least one storage unit.

The communication module 102 is configured to send a request for updating storage information of an article to the server, in order to allow the server to obtain updated storage information of an article according to the request for updating storage information of an article, when the detection module detects that the storage state of the corresponding storage unit is changed.

The power module 103 is configured to supply an operating voltage for the detection module and the communication module.

The storage device may include, but is not limited to, a conventional storage device, such as a wardrobe, a nightstand, a desk drawer, a portable storage box, and the like. Each of the storage devices has at least one storage unit which may be a physical space capable of being opened and closed, for example, the storage unit may be a drawer or a box or the like of the storage device such as a wardrobe and the like. The storage information of an article may include, but is not limited to, a type, a quantity, a specific location, a production date, a shelf life, a usage instruction, and the like of the article stored in the storage unit.

Specifically, the detection module 101 is mounted on the storage unit of the storage device and configured to detect whether the storage state of the storage unit is changed. In the present embodiment, the detection modules may be mounted one by one on each of the storage units, or may be integrally mounted on at least one storage unit of the storage device. Specifically, the storage state may refer to a human-computer interaction state or an opening and closing state of each storage unit. The human-computer interaction state refers to that when some parts of the human body, such as fingers, touch the storage unit, the storage unit can show the storage information of articles in the storage unit in the form of, for example, a picture, a sound, a video or the like, in order to allow an operator to select whether the storage unit needs to be opened. The opening and closing state refers to the state in which the storage unit is opened or closed. In addition, the communication module may be a wired communication module or a wireless communication module. In some embodiments, the communication module may be at least one of a WIFI module, a Bluetooth module, a ZigBee module, and a mobile data communication module. The power module 103 can provide operating voltages for the detection module 101 and the communication module 102 to ensure a normal operation of the storage detection module group 100.

In any period of time during which the storage detection module group is in operation, when the detection module 101 detects that the storage state of a certain storage unit is changed, the communication module 102 sends a request for updating storage information of an article to the server, and then the server sends the request for updating storage information of an article to a user terminal. The user updates the storage information of an article on the user terminal according to the request for updating storage information of an article, and then the updated storage information of an article is returned to the server by the user terminal. The user terminal may include, but is not limited to, a personal computer, a laptop, a tablet PC, a smart phone, a smart watch, and the like.

The storage detection module group 100 can assist the conventional storage device to complete a real-time update of the storage information of an article, thereby allowing the conventional storage device to realize the smart storage.

In an embodiment, the detection module includes at least one Hall sensor.

The Hall sensor is a kind of magnetic field sensor based on the Hall Effect. The Hall effect means that when a control current I is applied across the both ends of the semiconductor wafer and a uniform magnetic field with a magnetic induction of B is applied in the vertical direction of the semiconductor wafer, the semiconductor wafer will generate a potential difference UH, i.e. a hall voltage, in a direction perpendicular to the current and the magnetic field. The relationship may be expressed by: $U\_H = k\ IB/d$, where k is the Hall constant, which is related to the material of the semiconductor wafer; D is the thickness of the semiconductor wafer. Therefore, the Hall sensor can measure the change of the magnetic field by means of an electromagnetic relationship.

Specifically, when the user approaches or opens/closes the storage unit of the storage device, the Hall sensor mounted in the storage unit can detect the change of the surrounding magnetic field strength, thereby realizing detection of the storage state of the storage unit.

With the Hall sensor, the storage detection module group can detect whether the storage state of the storage unit is changed, and the detection is convenient, and the detection result is relatively accurate.

In an embodiment, the detection module further includes at least one of a temperature sensor and a humidity sensor.

The temperature sensor and the humidity sensor are respectively configured to monitor the temperature and humidity of the storage unit in real time to ensure that the storage unit can meet the storage condition of articles stored in the storage unit, and to prevent articles such as clothing, food and the like stored in the storage unit from being damaged or spoiled due to the substandard temperature or humidity conditions.

The storage detection module group can monitor the temperature and humidity conditions in the storage unit in real time by the temperature sensor and the humidity sensor, and prevent the articles stored in the storage unit from being damaged or spoiled due to the substandard storage conditions.

Figure 2:
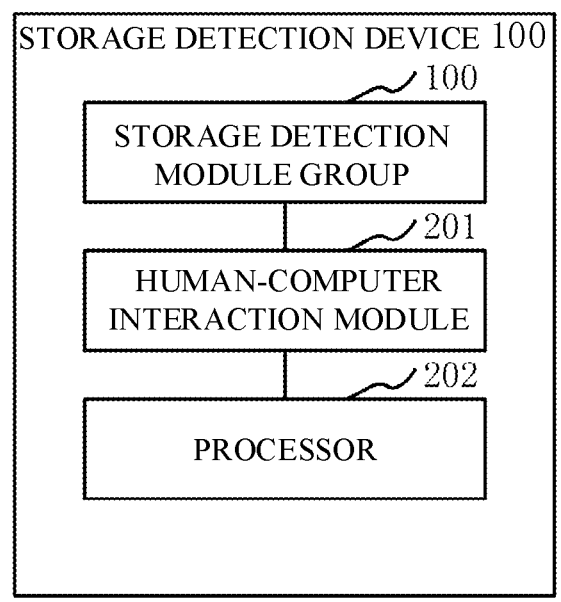
FIG. 2 is a schematic structural diagram of a storage detection device according to an embodiment of the present disclosure.

As shown in FIG. 2, an embodiment of the present disclosure provides a storage detection device 200. The storage detection device 200 includes a storage detection module group 100, a human-computer interaction module 201, and a processor 202.

The storage detection module group 100 is the storage detection module group as described above, and is configured to realize the real-time update of the storage information of an article.

The human-computer interaction module 201 is configured to send the prompt information, and to obtain the request for updating storage information of an article sent according to the prompt information, the pre-update storage information of an article, and the updated storage information of an article, when the detection module detects that the storage state of the storage unit is changed.

The processor 202 is configured to control the human-computer interaction module and the communication module, when the detection module detects that the storage state of the storage unit is changed.

Specifically, when the detection module 101 of the storage detection module group 100 detects that the storage state of the storage unit is changed, the human-computer interaction module 201 can send the prompt information to the user according to a control signal of the processor 202, in order to allow the user to select whether to update the current storage information of an article. When the user chooses to update the current storage information of an article, the human-computer interaction module 201 may receive an instruction that the user selects to update the storage information of an article (i.e., the request for updating storage information of an article). The communication module 102 of the storage detection module group 100 sends the request for updating storage information of an article to the user terminal by the server, and the user updates the storage information of an article on the user terminal according to the request for updating storage information of an article, and then returns the updated storage information of an article to the server. The power module 103 of the storage detection module group 100 is configured to supply the operating voltage to the entire storage detection device to ensure the normal operation of the storage detection device.

The storage detection device can assist the conventional storage device to realize a timely update of the storage information of an article, and send the prompt information to the user by the human-computer interaction module, in order to allow the user to actively select whether to update the storage information of an article, which avoids an interference to the user terminal caused by continuously sending the request for updating storage information of an article.

In an embodiment, the human-computer interaction module 201 includes a voice module and a touch screen.

The voice module is configured to send voice prompt information according to the control of the processor 202.

The touch screen is configured to display text prompt information, the pre-update storage information of an article, and the updated storage information of an article according to the control of the processor 202.

Specifically, when the detection module 101 detects that the storage state of the storage unit is changed, the voice module may send the voice prompt information according to the control signal of the processor 202 to prompt the user to select whether the storage information of an article of a certain storage unit needs to be updated. The touch screen displays the text prompt information according to the control signal of the processor 202, and asks the user whether the storage information of an article of a certain storage unit needs to be updated. When the user selects to update the current storage information of an article, the touch screen receives the instruction that the user selects to update the storage information of an article. The touch screen displays the pre-update storage information of an article for the user to update. After the user completes the update of the storage information of an article, the touch screen displays the updated storage information of an article. Furthermore, the human-computer interaction module 201 may further include a gesture recognition module which may change the storage state of the storage unit according to the gesture change of the operator. For example, when the operator swipes the touch screen of a certain storage unit with one hand, the storage unit can show the storage information of an article in the storage unit by means of a picture, a sound, a video, or the like; when the operator faces a certain storage unit and performs an upward lifting action with both hands, the storage unit may perform an opening action; when the operator faces a certain storage unit and performs an downward pressing action with both hands, the storage unit may perform a closing action.

In this embodiment, the storage detection device can realize the interaction with the user by the voice module, the touch screen and the gesture recognition module, and provide the user with the pre-update and updated storage information of an article in time.

In an embodiment, the touch screen included in the human-computer interaction module 201 is a flexible screen.

In the storage detection device of this embodiment, the touch screen is set as a flexible screen, which facilitates flexible display and improves durability of the device.

In an embodiment, the storage detection device 200 further includes a memory module configured to store the pre-update and the updated storage information of an article.

Specifically, when the detection module 101 of the storage detection module group 100 detects that the storage state of the storage unit is changed, the human-computer interaction module 201 may send the prompt information to the user according to the control signal of the processor 202, in order to allow user to select whether to update the current storage information of an article.

In an embodiment, when the user selects to update the current storage information of an article, the human-computer interaction module 201 receives the instruction that the user selects to update the storage information of an article (i.e., the request for updating storage information of an article). The communication module 102 of the storage detection module group 100 sends the request for updating storage information of an article to the user terminal by the server, and the user updates the storage information of an article on the user terminal according to the request for updating storage information of an article, and then returns the updated storage information of an article to the server. The server sends the updated storage information of an article to the storage detection device 200, and the storage detection device 200 stores the updated storage information of an article by the memory module.

In another embodiment, when the user selects to update the current storage information of an article, the human-computer interaction module 201 receives the instruction that the user selects to update the storage information of an article. According to the instruction that the user selects to update the storage information of an article, the human-computer interaction module 201 displays the pre-update storage information of an article stored in the memory module for the user to modify. When the user completes the modification of the storage information of an article, the memory module stores the updated storage information of an article. The communication module 102 sends the updated storage information of an article to the server according to the control of the processor 202.

Figure 3:
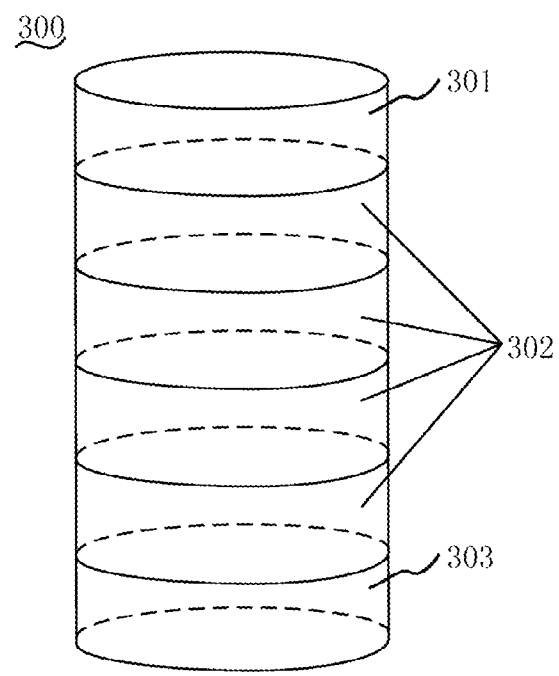
FIG. 3 is a schematic structural diagram of a smart storage device according to an embodiment of the present disclosure.

As shown in FIG. 3, an embodiment of the present disclosure provides a smart storage device 300. The smart storage device 300 includes a top base 301, at least one storage unit 302, and a bottom base 303.

The top base 301 is configured to accommodate the communication module 102, the human-computer interaction module 201, and the processor 202.

The storage unit 302 is mounted with the detection module 101.

The bottom base 303 is configured to support the storage unit 302 and to accommodate the power module 103.

Specifically, the communication module 102 is configured to send the request for updating storage information of an article to the server, in order to allow the server to obtain the updated storage information of an article according to the request for updating storage information of an article, when the detection module 101 detects that the storage state of the corresponding storage unit 302 is changed. The power module 103 is configured to provide the operating voltage. The human-computer interaction module 201 is configured to send the prompt information, and to obtain the request for updating storage information of an article sent according to the prompt information, the pre-update storage information of an article, and the updated storage information of an article, when the detection module 101 detects that the storage state of the storage unit is changed. The processor 202 is configured to control the human-computer interaction module 201 and the communication module 202, when the detection module detects that the storage state of the storage unit is changed.

Specifically, when the detection module 101 detects that the storage state of the storage unit 302 is changed, the human-computer interaction module 201 may send the prompt information to the user according to the control of the processor 202, in order to allow the user to select whether to update the current storage information of an article. When the user selects to update the current storage information of an article, the human-computer interaction module 201 receives the instruction that the user selects to update the storage information of an article (i.e., the request for updating storage information of an article), and display the pre-update storage information of an article. The communication module 102 sends the request for updating storage information of an article to the user terminal by the server, and the user updates the storage information of an article on the user terminal according to the request for updating storage information of an article, and then returns the updated storage information of an article to the server. The server sends the updated storage information of an article to the smart storage device 300, and the smart storage device 300 displays the updated storage information of an article by the human-computer interaction module 201.

In this embodiment, the smart storage device can realize the timely updating of the storage information of the articles in the storage unit by means of human-computer interaction, which is very convenient.

In a specific embodiment, the smart storage device 300 provided by the present disclosure includes the top base 301, at least one storage unit 302, and the bottom base 303. The top base 301 is configured to accommodate the communication module 102, the human-computer interaction module 201, and the processor 202. The storage units 302 are mounted with the detection modules 101 respectively. The bottom base 303 is configured to support the storage units 302 and to accommodate the power module 103.

Specifically, when the detection module 101 detects that the storage state of the storage unit 302 is changed, the voice module sends the voice prompt information according to the control of the processor 202 to prompt the user to select whether the storage information of an article of a certain storage unit needs to be updated. The touch screen displays text prompt information according to the control of the processor 202, and asks the user whether the storage information of an article of a certain storage unit needs to be updated. When the user selects to update the current storage information of an article, the touch screen receives the instruction that the user selects to update the storage information of an article (i.e., the request for updating storage information of an article), and displays the pre-update storage information of an article. The communication module 102 sends the request for updating storage information of an article to the user terminal by the server, and the user updates the storage information of an article on the user terminal according to the request for updating storage information of an article, and then returns the updated storage information of an article to the server. The server sends the updated storage information of an article to the smart storage device 300, and the smart storage device 300 displays the updated storage information of an article by the touch screen.

In an embodiment, when the user stores a drug in a certain storage unit 302 of the smart storage device 300, the user is required to upload the drug manual to the server by the user terminal to determine a taking time and a dosage of the drug. When the server receives the drug manual uploaded by the user, the server sends the manual to the smart storage device 300. When the detection module 101 detects that the user opens the storage unit 302 configured to store the drug, the smart storage device 300 displays the drug manual by the human-computer interaction module 201, and voice-broadcasts the taking time and the dosage of the drug. When the detection module 101 detects that the user closes the storage unit 302 configured to store the drug, the smart storage device 300 allows the user to confirm the taking condition of the drug by the human-computer interaction module 201, and timely updates the storage information of the drug, and sends the updated drug storage information to the server.

In an embodiment, in case that the user needs to use the smart storage device 300 to store food, since a production date and a shelf life of some foods are printed on the packing bag, it is difficult to know whether the food is expired once the packing bag is unpacked, therefore, the user needs to upload the production date and the shelf life of the food to server by the user terminal, or by the human-computer interaction module 201 of the smart storage device 300. In this way, the smart storage device 300 allows the user to know whether the stored food has expired.

Since the storage information of an article updated by the user via the user terminal and the smart storage device is synchronized to the server, when the user needs to inquire the storage information of an article of a certain article, by the user terminal, the user can directly search the storage information of an article stored in the server, so that the search for the required article can be performed very conveniently and efficiently.

Figure 4:
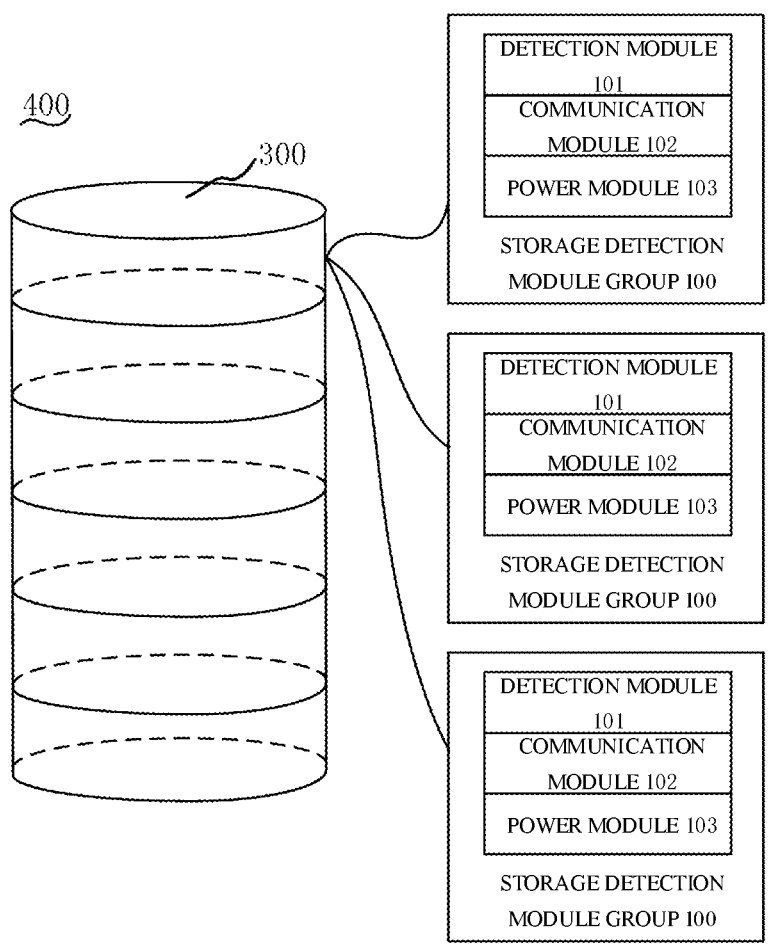
FIG. 4 is a schematic structural diagram of a smart storage system according to an embodiment of the present disclosure.

As shown in FIG. 4, an embodiment of the present disclosure provides a smart storage system 400. The smart storage system 400 includes the smart storage device 300 and the storage detection module group 100 as described above.

In this embodiment, the storage detection module group 100 is mounted on the conventional storage device such as a wardrobe, a bedside table, a desk drawer, a portable storage box, and the like, so that the conventional storage device can realize the smart storage.

Specifically, when the storage detection module group 100 detects that the storage state of the storage unit of the conventional storage device is changed, the message that the storage state of the storage unit is changed is sent to the smart storage device 300 by the communication module 102, so that the user can update the storage information of an article in the conventional storage device by the smart storage device 300.

In this embodiment, the smart storage system interconnects the storage information of an article of the conventional storage device with the storage information of an article of the smart storage device by the storage detection module group, which means that the conventional storage device is extended to the storage unit of the smart storage device. Therefore, the storage conditions of the articles in all the storage devices can be timely known and updated by the smart storage device, and an unified smart management of the article storage can be realized, which greatly facilitates the user to store and use articles.

The technical features of the above-described embodiments may be combined arbitrarily. To simplify the description, all the possible combinations of the technical features in the above embodiments are not described. However, all of the combinations of these technical features should be considered as within the scope of the present disclosure, as long as such combinations do not contradict with each other.

The above-described embodiments merely represent several embodiments of the present disclosure, and the description thereof is more specific and detailed, but it should not be construed as limiting the scope of the present disclosure. It should be noted that, for a person skilled in the art, several variations and improvements may be made without departing from the concept of the present disclosure, and these are all within the protection scope of the present disclosure. Therefore, the protection scope of the present disclosure shall be subject to the appended claims.

The invention claimed is:

1. A storage detection method for assisting a storage device to realize smart storage, the method comprising:
    detecting a storage state of the storage device, the storage state being associated with an opening state and a closing state of the storage device, the storage state being characterized by a change of state between the opening state and the closing state of the storage device;

upon detecting that the storage state of the storage device is changed, sending a request for updating storage information of an article to a server, which allows the server to obtain updated storage information of an article according to the request for updating storage information of an article;

wherein the storage device comprises a storage unit configured to perform an opening action according to a lifting gesture of a user.

2. The storage detection method of claim 1, wherein the detecting the storage state of the storage device comprises: detecting a change in a surrounding magnetic field strength by a Hall sensor mounted in the storage device, thereby detecting the storage state of the storage device, when a user approaches or opens or closes the storage device.

3. The storage detection method of claim 1, further comprising:

upon detecting that the storage state of the storage device is changed, sending prompt information and obtaining the request for updating storage information of an article sent according to the prompt information and pre-update storage information of an article and the updated storage information of an article; and upon detecting that the storage state of the storage device is changed, controlling a human-computer interaction module and a communication module.

4. The storage detection method of claim 1, wherein the storage unit is further configured to perform a closing action according to a pressing gesture of a user.

5. A storage detection device for assisting a storage device comprising at least one storage unit to realize smart storage, comprising:

a storage detection module group, wherein the storage detection module group comprises:

at least one detection module mounted on the at least one storage unit of the storage device, and configured to detect a storage state of the at least one storage unit;

a human-computer interaction module configured to send prompt information, and to obtain the request for updating storage information of an article sent according to the prompt information, a pre-update storage information of an article, and a updated storage information of an article, after the detection module detects that the storage state of the storage unit is changed, the human-computer interaction module comprising a gesture recognition module configured to make the storage unit perform an opening action according to a lifting gesture of the user; and a communication module configured to send a request for updating storage information of an article to a server, in order to allow the server to obtain updated storage information of an article according to the request for updating storage information of an article, after the detection module detects that the storage state of the at least one storage unit is changed; and a power module configured to supply an operating voltage for the detection module and the communication module.

6. The storage detection device of claim 5, wherein the detection module comprises at least one Hall sensor.

7. The storage detection device of claim 5, wherein the detection module further comprises at least one of a temperature sensor and a humidity sensor.

8. The storage detection device of claim 5, wherein the communication module comprises at least one of a WIFI module, a Bluetooth module, a ZigBee module, and a mobile data communication module.

9. The storage detection device of claim 5, further comprising:

a processor configured to control the human-computer interaction module and the communication module, after the detection module detects that the storage state of the storage unit is changed.

10. The storage detection device of claim 9, further comprising:

a memory module configured to store the pre-update storage information of an article and the updated storage information of an article.

11. The storage detection device of claim 9, wherein the human-computer interaction module comprises:

a voice module configured to send voice prompt information according to the control of the processor; and a touch screen configured to display text prompt information, the pre-update storage information of an article, and the updated storage information of an article according to the control of the processor.

12. The storage detection device of claim 11, wherein the touch screen is a flexible screen.

13. The storage detection device of claim 9, wherein the human-computer interaction module comprises a gesture recognition module configured to change the storage state of the storage unit according to a gesture of the user.

14. The storage detection device of claim 13, wherein the gesture recognition module is configured to make the storage unit display the storage information of an article in the storage unit according to a one-hand swiping gesture of the user.

15. The storage detection device of claim 13, wherein the gesture recognition module is configured to make the storage unit perform a closing action according to a pressing gesture of the user.

16. A smart storage device, comprising:

a top base configured to accommodate a communication module, a human-computer interaction module, and a processor;

at least one storage unit mounted with a detection module; and a bottom base configured to support the storage unit and accommodate a power module;

wherein the detection module is configured to detect a storage state of the at least one storage unit;

the communication module is configured to send a request for updating storage information of an article to a server, in order to allow the server to obtain updated storage information of an article according to the request for updating storage information of an article, after the detection module detects that the storage state of the at least one storage unit is changed;

the power module is configured to provide an operating voltage;

the human-computer interaction module is configured to send prompt information, and to obtain the request for updating storage information of an article sent according to the prompt information, pre-update storage information of an article, and the updated storage information of an article, after the detection module detects that the storage state of the storage unit is changed, the human-computer interaction module comprising a gesture recognition module configured to make the storage unit perform a closing action according to a pressing gesture of the user;

the processor is configured to control the human-computer interaction module and the communication module, after the detection module detects that the storage state of the storage unit is changed.

* * * * *